(12) United States Patent
Nuetzel et al.

(10) Patent No.: US 6,858,441 B2
(45) Date of Patent: Feb. 22, 2005

(54) MRAM MTJ STACK TO CONDUCTIVE LINE ALIGNMENT METHOD

(75) Inventors: Joachim Nuetzel, Fishkill, NY (US); Xian J. Ning, Mohegan Lake, NY (US); Kia-Seng Low, Hopewell Junction, NY (US); Gill Yong Lee, Wappingers Falls, NY (US); Rajiv M. Ranade, Brewster, NY (US); Ravikumar Ramachandran, Pleasantville, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/234,864

(22) Filed: Sep. 4, 2002

(65) Prior Publication Data

US 2004/0043579 A1 Mar. 4, 2004

(51) Int. Cl.$^7$ ............................................. H01L 21/28
(52) U.S. Cl. .......................... 438/3; 438/633; 438/975
(58) Field of Search .......................... 438/3, 626, 633, 438/638, 975

(56) References Cited

U.S. PATENT DOCUMENTS

| | | | | |
|---|---|---|---|---|
| 5,002,902 A | * | 3/1991 | Watanabe | 438/401 |
| 5,100,834 A | * | 3/1992 | Mukai | 438/662 |
| 5,401,691 A | * | 3/1995 | Caldwell | 438/633 |
| 5,503,962 A | * | 4/1996 | Caldwell | 430/317 |
| 5,663,099 A | * | 9/1997 | Okabe et al. | 438/642 |
| 5,738,961 A | * | 4/1998 | Chen | 430/22 |
| 5,958,800 A | * | 9/1999 | Yu et al. | 438/720 |
| 6,146,969 A | * | 11/2000 | Tan et al. | 438/401 |
| 6,447,634 B1 | * | 9/2002 | Zahorik et al. | 156/345.1 |
| 6,555,925 B1 | * | 4/2003 | Higashi et al. | 257/797 |
| 2001/0001077 A1 | * | 5/2001 | Tan et al. | 438/401 |
| 2001/0001571 A1 | * | 5/2001 | Johnson et al. | 355/77 |
| 2001/0001735 A1 | * | 5/2001 | Chu et al. | 438/690 |
| 2001/0040778 A1 | * | 11/2001 | Abraham et al. | 360/324.2 |
| 2002/0009876 A1 | | 1/2002 | Wege et al. | |
| 2002/0072195 A1 | * | 6/2002 | Anma et al. | 438/401 |
| 2002/0096775 A1 | | 7/2002 | Ning | |
| 2002/0100978 A1 | | 8/2002 | Tomita et al. | |
| 2002/0192926 A1 | * | 12/2002 | Schroeder et al. | 438/401 |
| 2003/0017707 A1 | * | 1/2003 | Yamashita et al. | 438/694 |
| 2003/0102576 A1 | * | 6/2003 | Teramoto | 257/797 |
| 2003/0224260 A1 | * | 12/2003 | Ning | 430/22 |
| 2004/0038543 A1 | * | 2/2004 | Zahorik et al. | 438/705 |
| 2004/0102014 A1 | * | 5/2004 | Ning et al. | 438/393 |

* cited by examiner

*Primary Examiner*—George Fourson
(74) *Attorney, Agent, or Firm*—Slater & Matsil, L.L.P.

(57) ABSTRACT

A method of manufacturing a resistive semiconductor memory device (100), comprising depositing an insulating layer (132) over a workpiece (30), and defining a pattern for a plurality of alignment marks (128) and a plurality of conductive lines (112) within the insulating layer (132). A conductive material is deposited over the wafer to fill the alignment mark (128) and conductive line (112) patterns. The insulating layer (132) top surface is chemically-mechanically polished to remove excess conductive material from the insulating layer (132) and form conductive lines (112), while leaving conductive material remaining within the alignment marks (128). A masking layer (140) is formed over the conductive lines (112), and at least a portion of the conductive material is removed from within the alignment marks (128). The alignment marks (128) are used for alignment of subsequently deposited layers of the resistive memory device (100).

27 Claims, 3 Drawing Sheets

MRAM MTJ STACK TO CONDUCTIVE LINE ALIGNMENT METHOD

CROSS-REFERENCE TO RELATED APPLICATIONS

This invention is related to U.S. patent application Ser. No. 09/854,760, filed on May 14, 2001 by Xian J. Ning, entitled "Design of Lithography Alignment and Overlay Measurement Marks on CMP Finished Damascene Surface", and U.S. patent application Ser. No. 10/161,867, filed on Jun. 3, 2001 by Xian J. Ning, entitled, "Lithography Alignment and Overlay Measurement Marks Formed by Resist Mask Blocking for MRAMs," which are incorporated herein by reference.

TECHNICAL FIELD

The present invention relates generally to the fabrication of semiconductor devices, and more particularly to the fabrication of magnetic random access memory (MRAM) devices.

BACKGROUND OF THE INVENTION

Semiconductors are used in integrated circuits for electronic applications, including radios, televisions, cell phones, and personal computing devices, as examples. One type of semiconductor device is a semiconductor storage device, such as a dynamic random access memory (DRAM) and flash memory, which use a charge to store information.

A more recent development in memory devices involves spin electronics, which combines semiconductor technology and magnetics. The spin of an electron, rather than the charge, is used to indicate the presence of a "1" or "0". One such spin electronic device is a magnetic random-access memory (MRAM), which includes conductive lines positioned perpendicular to one another in different metal layers, the conductive lines sandwiching a magnetic stack. The place where the conductive lines intersect is called a crosspoint. A current flowing through one of the conductive lines generates a magnetic field around the conductive line and orients the magnetic polarity into a certain direction along the wire or conductive line. A current flowing through the other conductive line induces the magnetic field and can partially turn the magnetic polarity, also. Digital information, represented as a "0" or "1", is storable in the alignment of magnetic moments. The resistance of the magnetic component depends on the moment's alignment. The stored state is read from the element by detecting the component's resistive state. A memory cell may be constructed by placing the conductive lines and cross-points in a matrix structure having rows and columns. Magnetic stacks or cells in the cross-point array are usually selected by passing sub-threshold currents through the conductive lines, e.g., in both the x- and y-direction, and where the conductive lines cross, the combined magnetic field is large enough to flip the magnetic orientation.

An advantage of MRAMs compared to traditional semiconductor memory devices such as DRAMs is that MRAMs are non-volatile. For example, a personal computer (PC) utilizing MRAMs would not have a long "boot-up" time as with conventional PCs that utilize DRAMs. Also, an MRAM does not need to be powered up and has the capability of "remembering" the stored data.

Alignment techniques are implemented during manufacturing processes to ensure correct alignment of the various layers with one another within semiconductor devices such as MRAMs. Typically, alignment marks are utilized in the layers to assist in the alignment of features in different layers.

MRAM devices are typically processed using structures upon which are formed a plurality of magnetic metal stacks which comprise the magnetic memory cells. A magnetic stack comprises many different layers of metals and a thin layer of dielectric having a total thickness of a few tens of nanometers. The magnetic stacks are typically built on top of copper wires embedded in an inter-level dielectric (ILD) material.

Because the magnetic stacks are not transparent to light, the lithography on top of the magnetic stack layer requires topographic features for alignment and overlay measurement marks on the magnetic stack layer. Typically, this underlying magnetic stack layer requires a chemical mechanical polish (CMP) process as a finish step.

Alignment marks are usually formed using additional lithography and reactive ion etch (RIE) steps to generate marks on the CMP-finished surface that exposes the copper and dielectric patterns. However, forming alignment marks in this manner requires an additional RIE process step and subsequent cleaning steps, thus increasing the processing costs and also increasing the chance of leaving particles on the CMP finished level. Also, the additional lithography mask must be aligned to an underlying layer, which reduces the overall overlay tolerance.

SUMMARY OF THE INVENTION

Preferred embodiments of the present invention achieve technical advantages as a method of transferring the previous level alignment and overlay marks into a magnetic stack level and subsequent levels.

In one embodiment, a method of manufacturing a resistive semiconductor memory device includes providing a semiconductor workpiece, forming an insulating layer over the workpiece, and defining a pattern for a plurality of alignment marks and a pattern for a plurality of conductive lines within the insulating layer. The alignment mark and conductive line patterns are filled with a conductive material to form conductive lines. A masking layer is formed over the conductive lines. At least a portion of the conductive material is removed from the alignment mark pattern, wherein the alignment marks may be used for alignment of subsequent layers of the resistive semiconductor memory device.

In another embodiment, a method of manufacturing a MRAM device includes providing a semiconductor workpiece, forming an insulating layer having a top surface over the workpiece, and, using a damascene process, patterning the insulating layer to form a plurality of alignment marks and a plurality of trenches for conductive lines. The alignment mark and conductive line patterns are filled with a conductive material to form conductive lines. A masking layer is formed over the conductive lines, and at least a portion of the conductive material is removed from the alignment mark pattern so that the alignment marks may be used for alignment of subsequent layers of the resistive semiconductor memory device. The masking layer is removed from over the conductive lines.

Advantages of embodiments of the invention include forming an MRAM device, wherein the same alignment and overlay measurement marks in a CMP-finished level (such as the process flow for forming conductive lines, to be described further herein) are used as the alignment and overlay measurement marks that are used to align a subsequently-deposited magnetic material stack and subsequent layers of the MRAM device. Furthermore, alignment is more accurate, because there is no need to align new alignment marks with already existing alignment marks. The alignment mark depth is adjustable, by either removing all of the conductive material from within the alignment marks, or by removing a portion of the conductive material from the alignment marks. The masking layer is strippable by a solvent, without impairing the quality of the underlying conductive lines. The method provides a cost savings because patterning of the insulating layer is not required.

BRIEF DESCRIPTION OF THE DRAWINGS

The above features of the present invention will be more clearly understood from consideration of the following descriptions in connection with the accompanying drawings in which.

Corresponding numerals and symbols in the different figures refer to corresponding parts unless otherwise indicated. The figures are drawn to clearly illustrate the relevant aspects of the preferred embodiments and are not drawn to scale.

DETAILED DESCRIPTION OF PREFERRED EMBODIMENTS

Prior art alignment methods for MRAM devices will be discussed, followed by a description of preferred embodiments of the present invention and a discussion of some advantages of embodiments of the present invention.

Figure 1:
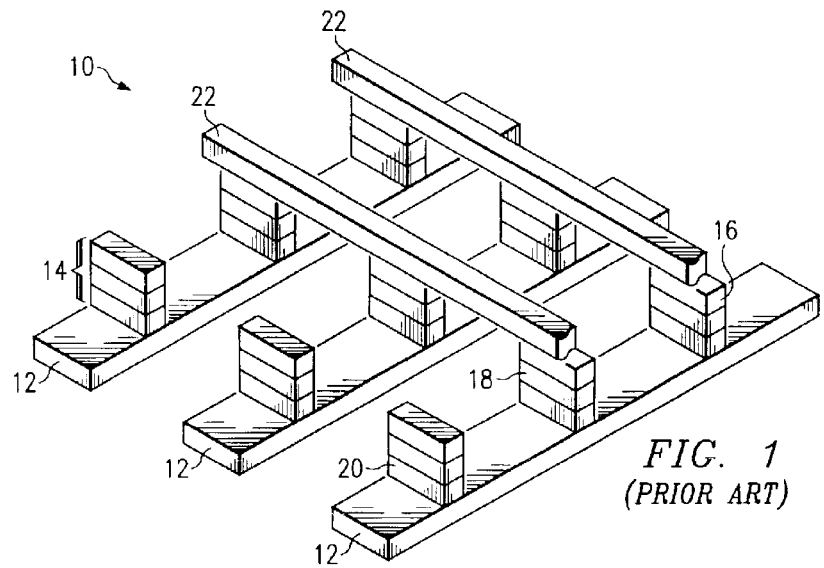
FIG. 1 shows a perspective view of a prior art MRAM device having magnetic tunnel junctions (MTJ's) positioned at intersections of first conductive lines and overlying second conductive lines.

A prior art MRAM device 10 having conductive lines 12 and 22 running in a first and second direction and comprised of a conductive material such as aluminum or copper, for example, is shown in FIG. 1. A workpiece (not shown) is provided, and the workpiece may comprise one or more layers of a dielectric such as silicon oxide or low-k materials disposed over silicon single-crystal silicon, for example. The workpiece may include other conductive layers or other semiconductor elements, e.g., transistors, diodes, etc.

A first inter-level dielectric layer (not shown) is deposited over the workpiece. The inter-level dielectric may comprise silicon dioxide, for example. The interlevel dielectric layer is patterned, for example, for vias, and etched. The vias may be filled with a metal such as copper, tungsten or other metals, for example.

A metallization layer, referred to herein as an M2 layer, is formed next. If copper is used for the conductive lines 12, typically, a damascene process is used to form the conductive lines 12. A dielectric layer, not shown, is deposited over inter-level dielectric layer. The dielectric layer is patterned and etched, and the trenches are filled with a conductive material to form conductive lines 12 in the M2 layer.

Next, a magnetic stack 14 is formed over conductive lines 12. Magnetic stack 14 typically comprises a first magnetic layer 20 including a plurality of layers of materials such as IrMn, FeMn, NiMn, PtMn, CoFe, Ru, NiFe, Ta, TaN, or Cu, for example. The first magnetic layer 20 is often referred to as a hard layer. Magnetic stack 14 also includes a dielectric layer 18, comprising $Al_2O_3$, for example, deposited over the first magnetic layer 20. The dielectric layer 18 is often referred to as a tunnel layer. Magnetic stack 14 also includes a second magnetic layer 16 comprising a multi-layer structure having similar materials as the first magnetic layer 20. Second magnetic layer 16 is often referred to as the soft layer. The first magnetic layer 20, dielectric layer 18 and second magnetic layer 16 are patterned to form magnetic stacks 14.

Conductive lines 22 running in a different direction than conductive lines 12 are formed over magnetic stacks 14. Conductive lines 22 may be formed within the next layer, herein referred to as an M3 layer, for example. If conductive lines 22 comprise copper, again, a damascene process is typically used. A dielectric layer (not shown) is deposited over magnetic stacks 14 and conductive lines 22. The dielectric layer is patterned and etched with trenches that will be filled with a conductive material to form conductive lines 22. Alternatively, a non-damascene process, such as Al RIE, for example, may be used to form conductive lines 12 and 22. Conductive lines 12 and 22 function as the wordlines and bitlines of the memory array 10, for example.

The order of the magnetic stack 14 layers may be reversed, e.g., the hard layer 20 may be on the top, and the soft layer 16 may be on the bottom of the insulating layer 18. Similarly, the wordlines 12 and bitlines 22 may be disposed either above or below the magnetic stacks 14, for example.

One type of MRAM design such as the one shown in FIG. 1 comprises an array of magnetic bits or magnetic stacks 14 situated at the cross-points between two conductive lines 12 and 22, often referred to as a cross-point design. Information is stored in the soft magnetic layer 16 of the magnetic stacks 14. To store the information, a magnetic field is necessary. This magnetic field is provided by a wordline and bitline current which is passed through conductive lines 12 and 22. Information is stored in the bits 14 by aligning the magnetization of one ferromagnetic layer (information layer) either parallel or antiparallel to a second magnetic layer (reference layer). The information is detectable due to the fact that the resistance of the element in the parallel case is different from the antiparallel case.

In manufacturing a resistive memory device such as the one shown in FIG. 1, alignment of the MTJ's 14 to the first and second conductive lines 12/22 is important. However, since the materials of the MTJ's 14 are opaque, the alignment marks must be topographical (e.g., three-dimensional or recessed below the wafer top surface), rather than optically visual. Alignment marks that are co-planar with the top surface of the wafer would not transfer the alignment mark pattern to the top surface of a subsequently deposited layer.

Figure 2:
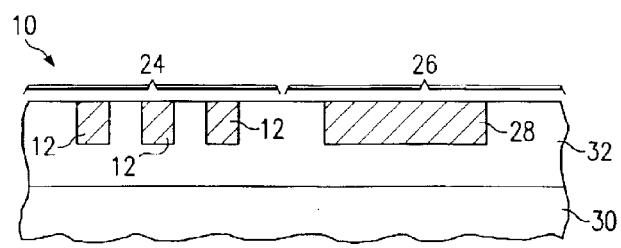
FIGS. 2 and 3 show cross-sectional views of a prior art method of forming alignment marks for a resistive memory device.
Figure 3:
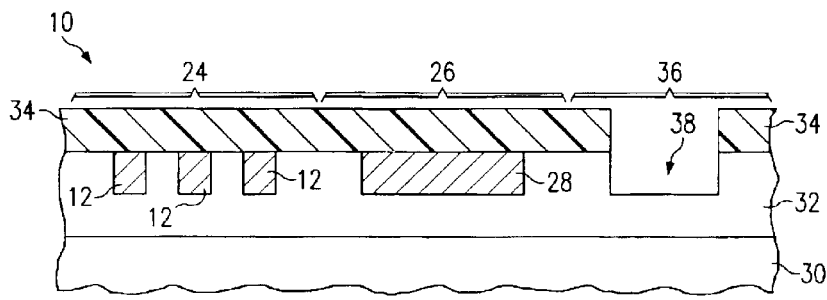

A prior art method of aligning the MTJ's 14 to underlying first conductive lines 12 of a MRAM device 10 is shown in a cross-sectional view in FIGS. 2 and 3. An insulating layer 32 is formed over a semiconductor workpiece 30 which may comprise a silicon wafer, as an example. The workpiece 30 comprises memory cell regions 24 and alignment mark regions 26. The insulating layer 32 is patterned, in a damascene process, for example, to form trenches and holes for conductive lines 12 and first alignment marks 28. The first alignment marks 28 are larger than conductive lines 12, which may comprise a minimum feature size, for example. Typically, both the conductive line 12 pattern and first alignment mark 28 pattern are formed in a single step.

A conductive material is deposited to fill the conductive line and alignment mark patterns with the conductive material. The workpiece is exposed to a chemical-mechanical polish (CMP) process to remove the excess conductive material from the top of the insulating layer 32, as shown in FIG. 2, forming conductive lines 12 and leaving conductive material residing within the first alignment marks 28.

After the CMP process, the resulting workpiece top surface is smooth and planar. The next step in the fabrication process of the resistive memory device is the deposition of a magnetic stack layer (not shown). The magnetic stack layer is later patterned to form MTJ's, which function as the memory cells of the array. As described above with reference to FIG. 1, the magnetic stack layer comprises a plurality of conductive materials and is opaque to light. Therefore, the fact that the workpiece top surface is planar is a problem, because the first alignment marks 28 will not be optically visible after the deposition of the magnetic stack materials, and thus, the first alignment marks 28 may not be used to align subsequently formed MTJ's to the conductive lines 12.

A prior art method of aligning the conductive lines 12 to the next subsequently deposited magnetic stack layer of an MRAM device 10 is shown in FIG. 3. A resist 34 is deposited over the workpiece 30 having an array region 24 and a first alignment mark region 26. The resist 34 typically comprises an organic polymer, and is usually transparent or translucent. The resist 34 is patterned, for example, using a lithographic mask step and a subsequent etch, e.g., RIE, for example, and the insulating layer 32 is etched to form second alignment marks 38 in second alignment mark region 36. Only one second alignment mark 38 is shown in FIG. 3, although at least one second alignment mark 38 is formed in at least one second alignment mark region 36, as shown.

Because the resist 34 is transparent or translucent, the first alignment marks 28 are visible through the resist 34, and the first alignment marks 28 may be used for visual alignment of the second alignment marks 38. The second alignment marks 38, still visible as topography after the deposition of the magnetic stack layers, may be used to pattern magnetic elements in subsequent processing steps. However, typically, misalignment occurs during the indirect topographical alignment shown in FIG. 3. It is desirable to achieve the best possible alignment of the conductive lines 12 to subsequently formed features such as memory elements and other devices, in order for the memory device 10 to function properly.

Embodiments of the present invention achieve technical advantages as a method of aligning MTJ's and subsequently deposited layers to underlying conductive lines of a resistive memory device. No additional alignment marks are required to be formed in an insulating layer of a resistive memory device in accordance with the method. A masking layer is deposited over the workpiece, and the alignment mark region is opened, during which precise alignment is not necessary. Conductive material is removed from the alignment marks, so the alignment marks may be used to topographically align the MTJ layer to the underlying conductive lines.

Figure 4:
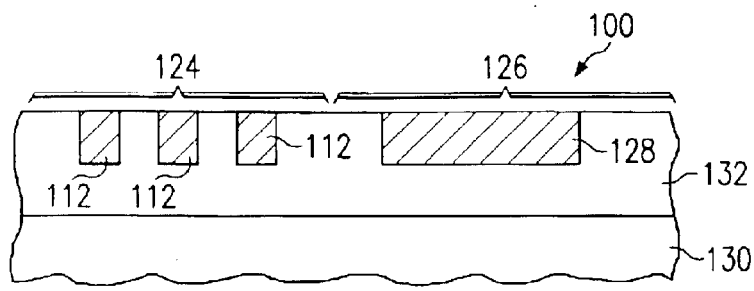
FIGS. 4 through 8 illustrate cross-sectional views of a resistive memory device at various stages of manufacturing in accordance with an embodiment of the present invention.

FIGS. 4 through 8 illustrate cross-sectional views of an MRAM device in various stages of manufacturing, in accordance with a first embodiment of the present invention. FIG. 4 shows a semiconductor wafer that will be processed to form a MRAM device 100, including a workpiece 130. The workpiece 130 may include a semiconductor substrate comprising silicon or other semiconductor materials covered by an insulating layer, for example. The workpiece 130 may also include other active components or circuits formed in the front end of line (FEOL), not shown. The workpiece 130 may comprise one or more layers of silicon oxide or low-k material disposed over single-crystal silicon, for example. The workpiece 130 may include other conductive layers or other semiconductor elements, e.g. transistors, diodes, etc. Compound semiconductors, GaAs, InP, Si/Ge, or SiC, as examples, may be used in place of silicon. The workpiece includes at least one array region 124, where memory cells will be formed, and at least one alignment mark region 126, where alignment marks will be formed.

An insulating layer 132 is deposited over the workpiece 130. The insulating layer 132 preferably comprises an inter-level dielectric (ILD) layer, e.g., the wafer first inter-level dielectric. Alternatively, the insulating layer 132 may comprise a second or third inter-level dielectric, for example. The insulating layer 132 preferably comprises silicon dioxide ($SiO_2$) and may alternatively comprise other dielectric materials such as low dielectric constant materials, for example.

The insulating layer 132 is patterned and etched to define a pattern for a plurality of conductive lines 112 and alignment marks 128 within the insulating layer 132, as shown. For example, the conductive lines 112 may include a plurality of parallel trenches arranged in a row extending lengthwise, and the alignment marks 128 may be square or rectangular, and may comprise other shapes such as crosses or T's, as examples. The trenches may comprise a single damascene (shown in FIG. 4) or dual-damascene pattern (not shown), formed by lithography and RIE, as examples. The insulating layer 132 may be lithographically patterned and reactive ion etched (RIE) to form trenches for conductive lines 112 and alignment marks 128, for example, in a single step or two separate steps, as examples.

The alignment mark 128 trenches and the conductive line 112 trenches may comprise the same depth within the insulating layer 132, for example. The conductive line 112 trenches may be about 0.2 $\mu$m wide and 0.4 to 0.6 $\mu$m deep, and the alignment mark 128 trenches may be about 5 to 20 $\mu$m wide, as examples. The alignment mark 128 trenches are also referred to herein as alignment marks. The alignment mark 128 trenches may also comprise overlay measurement marks, for example.

A conductive material, preferably comprising copper, for example, is deposited over the workpiece 130 and within the conductive line 112 trenches, as shown in FIG. 4. The conductive material fills the alignment marks 128 and conductive line 112 patterns. The conductive material may comprise a metal such as copper, preferably deposited by plating. Alternatively, the conductive material may comprise other conductive materials such as Al, TiN, Ti, W, Ta, TaN, combinations thereof, or other conductive materials, deposited by physical vapor deposition (PVD) or chemical vapor deposition (CVD), as examples. The conductive line 112 material for an MRAM device preferably comprises copper, which is desirable for its superior conductivity and the ability to use smaller conductive lines because of the high conductivity of copper. Preferably, the conductive line 112 material comprises a conductive material stack comprising Cu over one or more layers such as Ta and TaN, for example.

Prior to depositing the conductive material, a liner and/or barrier layer (not shown) may be deposited to protect the insulating layer 132 from diffusion of elements of the conductive material into the insulating layer 132. For example, a liner maybe used that is preferably conductive, which may comprise a barrier layer and a seed layer. The barrier layer preferably comprises a material having a high conductivity that provides good adhesion to the underlying insulating layer 132 and also is adapted to act as a diffusion barrier, to prevent subsequently deposited materials such as copper from diffusing through the insulating layer 132. The barrier layer may comprise a copper barrier, for example. For example, if conductive lines 112 comprise copper, preferably, the liner comprises a copper barrier layer deposited over the insulating layer 132 surface within the trenches, including along the trench sidewalls. The barrier layer may comprise TaN, TiN, WN, Ta, or combinations thereof, as examples. The barrier layer may alternatively comprise other materials. The barrier layer may be deposited in a thickness of about 5–100 nm, as an example.

The liner may also include a seed layer comprising a copper seed layer, for example, formed over the copper barrier, also not shown. See U.S. patent application Ser. No. 10/161,867, filed on Jun. 3, 2001 by Xian J. Ning, entitled, "Lithography Alignment and Overlay Measurement Marks Formed by Resist Mask Blocking for MRAMs," which is incorporated herein by reference. The seed layer is adapted to improve the deposition of subsequently deposited conductive material, for example, in an electroplating process. The seed layer may comprise pure copper, a copper alloy comprising magnesium, indium, aluminum, or combinations thereof, as examples. Alternatively, the seed layer may comprise other conductive materials. The seed layer may be deposited in a thickness of about 50–200 nm, for example.

After depositing a conductive material over the insulating layer to fill the alignment mark and conductive line patterns, the insulating layer top surface is polished, for example, using a chemical-mechanical polish (CMP) process, to remove excess conductive material from the top surface of the insulating layer 132, forming conductive lines 112 and leaving conductive material within the alignment marks 128. The conductive lines 112 may comprise wordlines or bitlines of the MRAM device 100, for example. The top surface of the wafer, e.g., the insulating layer 132, conductive lines 112 and conductive material within alignment marks 128 top surfaces are smooth and planar at this point in the fabrication process.

The damascene process described herein is preferably used to form conductive lines 112 comprising copper, because copper is difficult to etch. Conductive lines 112 may be part of an M1 or M2 metallization layer, as examples. The conductive lines 112 may comprise minimum pitched lines (e.g., having the smallest feature size) or alternatively, the conductive lines 112 may comprise larger pitched lines.

Figure 5:
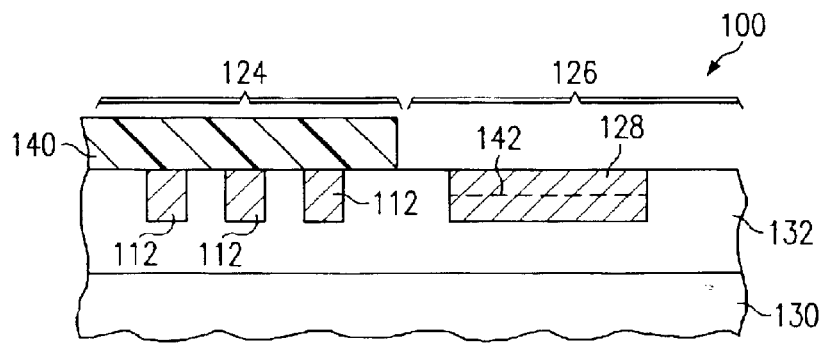

Referring to FIG. 5, a masking layer 140 is formed over the conductive lines 112 and the first insulating layer 132. In one embodiment, the masking layer 140 comprises a resist; alternatively, the masking layer 140 may comprise an additional sacrificial layer such as a nitride, to be described further herein. In the embodiment shown in FIG. 5, the masking layer 140 preferably comprises a resist, comprising an organic polymer photoresist, for example. The masking layer 140 is patterned using lithography, and portions of the masking layer 140 are removed, leaving the masking layer 140 remaining over conductive lines 112 in the array region 124, as shown.

The masking layer 140 is opened over the alignment mark region 126, as shown. The masking layer 140 masks the conductive lines 112 in the array region 124 while portions of the conductive material are removed from the alignment marks 128. Because the masking layer 140 is not used to actually pattern the insulating layer 132, a larger area of masking layer 140 may be removed from over the alignment mark 128, creating a larger processing window. For example, the masking layer 140 may be removed from the sides of the alignment mark 128. Generally, the alignment mark region 126 is separated from the array region 124 by about 10 μm or more, for example, which allows for flexibility in the patterning of the masking layer 140, providing some 'play' in the dimensioning. Exact alignment of the resist 140 with the alignment marks 128 is not required, because of the separation between the alignment marks 128 and the conductive lines 112.

Figure 6:
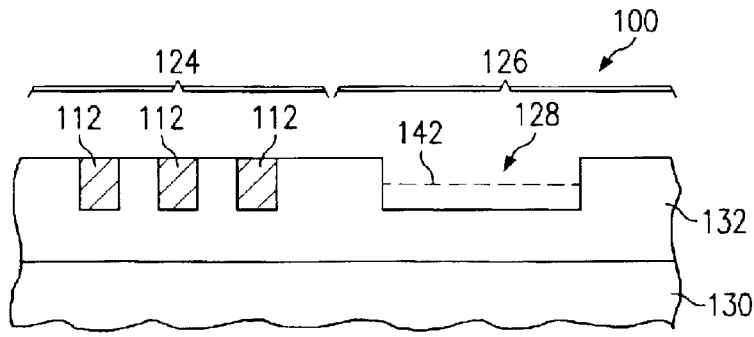

In accordance with embodiments of the present invention, at least a portion of the conductive material within the alignment mark 128 pattern is removed. Preferably, the alignment mark 128 conductive material is removed using a wet etch, as an example, although, alternatively, a dry etch may be used to remove the alignment mark 128 conductive material. The alignment mark conductive material may be removed to a predetermined height 142 below the top surface of the insulating layer 132, as shown in FIG. 5. Alternatively, all of the conductive material residing within the alignment mark 128 trenches may be removed, as shown in FIG. 6. Preferably, the conductive material is removed from the alignment mark 128 to a level at least between about 500 to 1000 Angstroms from the insulating layer top surface, to ensure adequate topography for subsequent alignment of the MTJ stack and other material layers of the resistive memory device 100.

The masking layer 140 is removed from the insulating layer 132, as shown in FIG. 6, leaving conductive lines 112 having a smooth surface, and being coplanar with the insulating layer 132. The alignment marks 128 are now free of conductive material, or have conductive material residing therein to a predetermined height 142, shown in phantom. If the masking layer 140 comprises a resist, preferably the resist 140 is removed using a solvent, for example, which advantageously will not impair the copper conductive line 112 material. The top surface of the MRAM device 100 may be smoothed with another CMP step.

Figure 7:
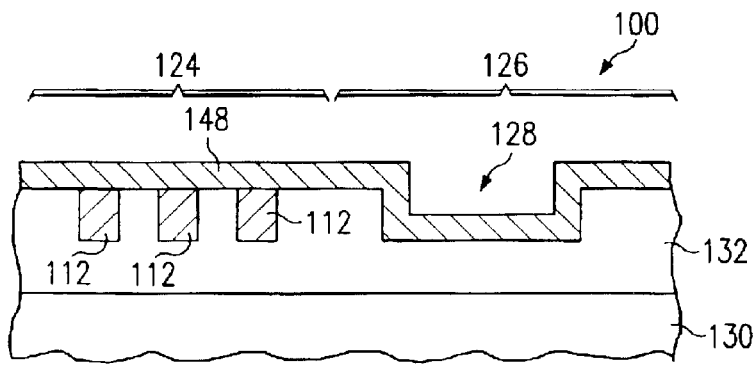

Next, a magnetic stack material 148 is deposited over the wafer to line all exposed surfaces, such as the conductive lines 112, insulating layer 132 top surface, and alignment mark trenches 128 sidewalls and bottom surfaces, as shown in FIG. 7. The magnetic stack material 148 preferably comprises a non-transparent metal level. More particularly, the magnetic stack material 148 preferably comprises a first magnetic layer comprised of a plurality of layers of materials such as PtMn, CoFe, Ru, NiFe, Ni, Co, Ta, TaN, Cu, and/or combinations thereof, using various ratios of these chemical elements, as examples. Magnetic stack material 148 includes a dielectric layer, comprising aluminum oxide ($Al_2O_3$), for example, deposited over the first magnetic layer. Magnetic stack material 148 also includes a second magnetic layer deposited over the dielectric layer, the second magnetic layer comprising a similar multi-layer structure using similar materials as the first magnetic layer. The various material layers of the magnetic stack may be deposited by PVD or Ion-Beam assisted Deposition (IBD), for example.

Figure 8:
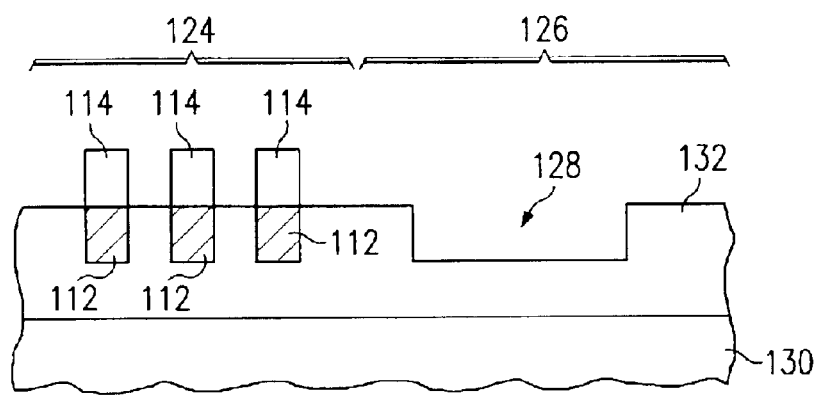

The topography of the alignment marks 128 is transferred to the surface of the magnetic stack-material 148 and is visible from the top surface of the wafer. The magnetic stack material 148 is patterned using lithography and is etched to form magnetic memory cells 114 or magnetic tunnel junctions (MTJ's) over the conductive lines 112, as shown in FIG. 8.

Advantageously, the magnetic stack material 148 is removed from the alignment mark trenches 128 in this processing step, so that the same alignment marks 128 may be used in subsequent lithography process or processes. Processing of the MRAM device 100 is continued, such as depositing a tunnel junction insulator, and forming conductive lines over the magnetic memory cells 114 to form wordlines or bitlines of the MRAM array 100, for example (not shown, see FIG. 1).

Figure 9:
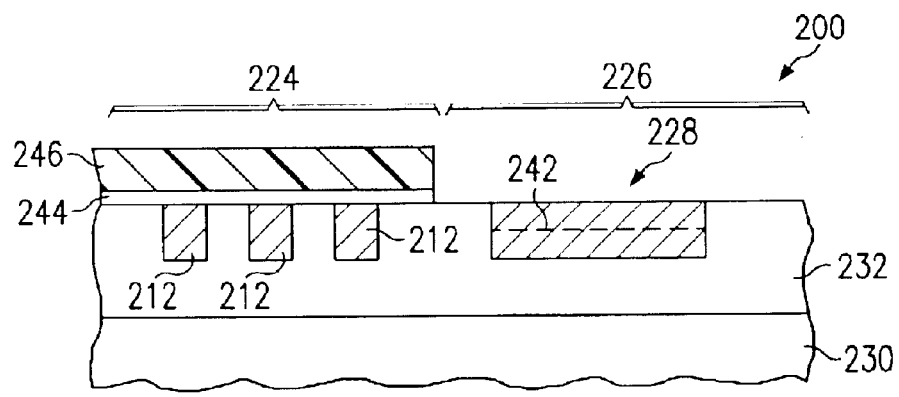
FIGS. 9 and 10 illustrate cross-sectional views of a resistive memory device at various stages of manufacturing in accordance with another embodiment of the present invention.
Figure 10:
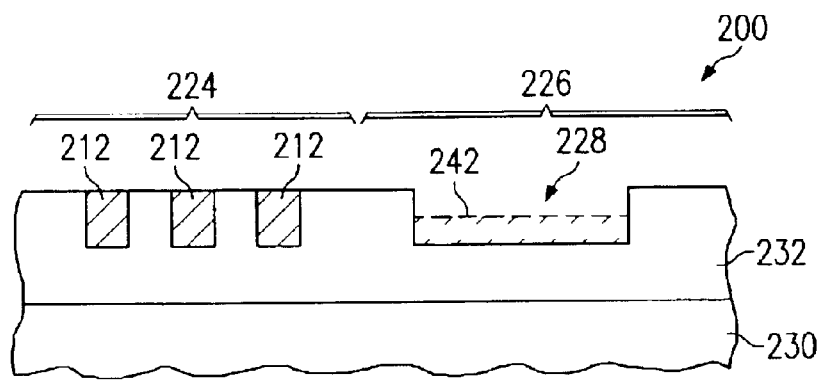

FIGS. 9 and 10 illustrate an alternative embodiment of the present invention wherein a masking layer 244 and a resist 246 are used to remove conductive material from within the alignment marks 228. After the processing steps described for FIG. 4, a masking layer 244 is deposited over the wafer surface to cover conductive lines 212, exposed portions of the insulating layer 232, and the conductive material within alignment marks 228. The masking layer 244 preferably comprises a material that may be etched selective to the insulating layer 232 and the conductive material, such as a nitride. The masking layer 244 may comprise tantalum nitride or silicon nitride, as examples, deposited in a thickness of 100 to 1000 Å, for example.

A resist 246 is deposited over the masking layer 244. The resist 246 may comprise a photoresist or organic polymer, as examples. The resist 246 is patterned and etched to remove portions of resist from over the alignment mark regions 226. The resist 246 is used to pattern the masking layer 244, and portions of the masking layer 244 are removed from the alignment mark regions 226. The resist 246 in the array regions 224 is removed, and the masking layer 244 is used to protect the conductive lines 212 in the array regions 224 during the removal of conductive material from the alignment trenches 228.

The conductive material may be completely removed from the alignment marks 228, or the conductive material may be removed to a predetermined height 242 below the insulating layer 232 surface within the alignment mark 228 pattern, as shown in FIG. 9. The masking layer 244 is removed after the removal of the conductive material from the alignment marks 228, as shown in FIG. 10.

As in the embodiment described for FIGS. 4 through 8, a magnetic stack material is deposited over the wafer, as shown in FIG. 7. The magnetic stack material is patterned and etched, leaving magnetic memory cells disposed over the first conductive lines, as shown in FIG. 8. The alignment mark trenches are then used for alignment during subsequent processing of the wafer.

Embodiments of the present invention achieve technical advantages as a process for forming an MRAM device 100/200 wherein the same alignment and overlay measurement marks 128/228 in a CMP-finished level (such as the process flow for forming conductive lines 112/212 described herein) are used as the alignment and overlay measurement marks 128/228 that are used to align a subsequently-deposited magnetic material stack 148. A masking layer 140 is used to block the conductive lines 112 during the removal of conductive material within the alignment marks 128. The alignment mark 128/228 depth is adjustable, being either a predetermined depth below the top surface of the insulating layer 132/232, or the entire depth of the original alignment marks 128/228. A anti-reflective coating (ARC) is not required, and the masking layer 140 is strippable by a solvent, the use of which will not impair the quality of the underlying conductive lines 112. The method provides a cost savings because patterning of the insulating layer 132/232 is not required.

The original alignment and overlay measurement marks 128/228 are preserved, increasing alignment accuracy between layers. The direct alignment of the MTJ patterning to the M2 metal level in accordance with embodiments of the present invention is more accurate than the indirect alignment of the prior art, described herein with reference to FIG. 3. The entire alignment mark region 126/226 is opened prior to removal of the conductive material within the alignment marks 128/228, rather than opening the area of the alignment mark 128/228 only, which provides an increased processing margin.

Embodiments of the invention are described with reference to a particular application for an MRAM cell herein; however, embodiments of the invention also have application in other resistive semiconductor devices.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of manufacturing a semiconductor device, comprising:
   providing a semiconductor workpiece;
   forming an insulating layer over the workpiece;
   defining in a single step a pattern for a plurality of alignment marks and a pattern for a plurality of conductive lines within the insulating layer, the alignment marks having a topography;
   filling the alignment mark and conductive line patterns with a conductive material to form conductive lines;
   forming a masking layer over the conductive lines;
   removing at least a portion of the conductive material from the alignment mark pattern, wherein the alignment marks may be used for alignment of subsequent layers of the semiconductor device;
   removing the masking layer from over the conductive lines,
   depositing a magnetic stack layer over the insulating layer, conductive lines; and alignment marks, the magnetic stack layer having a top surface, wherein the magnetic stack layer partially fills the alignment marks, wherein the topography of the alignment marks is visible in the top surface of the magnetic stack layer; and
   patterning the magnetic stack layer to form a magnetic tunnel junction (MTJ) over at least one of the conductive lines, using the topography of the alignment marks visible in the top surface of the magnetic stack layer to align the MTJ to the conductive lines.

2. The method according to claim 1, wherein filling the alignment mark and conductive line patterns comprises:
   depositing a conductive material over the workpiece to fill the alignment mark and conductive line patterns; and
   using a chemical-mechanical polish process to remove excess conductive material from a top surface of the insulating layer.

3. The method according to claim 1, wherein forming the masking layer comprises:
   depositing a masking material over the conductive lines and alignment mark pattern;
   patterning the masking material; and
   removing the masking material from over the alignment mark pattern, leaving masking material residing over the conductive lines.

4. The method according to claim 3, wherein the masking material comprises a resist.

5. The method according to claim 3, wherein the masking material comprises a nitride.

6. The method according to claim 5, wherein the masking material comprises tantalum nitride or silicon nitride.

7. The method according to claim 5, further comprising:
   depositing a resist over the masking layer, after depositing the masking material; and
   using the resist to pattern the masking layer.

8. The method according to claim 1, wherein depositing a conductive material comprises depositing a material including copper.

9. The, method according to claim 8, further comprising depositing a liner, before depositing the conductive material.

10. The method according to claim 1, wherein the semiconductor device comprises a magnetic random access memory (MRAM).

11. A method of manufacturing a magnetic random access memory (MRAM) device, comprising:
   providing a semiconductor workpiece;
   forming an insulating layer having a top surface over the workpiece;
   using a damascene process, patterning in a single step the insulating layer to form a plurality of alignment marks and a plurality of trenches for conductive lines;
   filling the alignment mark and conductive line patterns with a conductive material to form conductive lines;
   forming a masking layer over the conductive lines;
   removing at least a portion of the conductive material from the alignment mark pattern so that the alignment marks may be used for alignment of subsequent layers of the MRAM device;
   removing the masking layer from over the conductive lines;
   depositing a magnetic stack layer over the insulating layer, conductive lines, and alignment marks, the magnetic stack layer having a top surface, wherein the magnetic stack layer partially fills the alignment marks, wherein the topography of the alignment marks is visible in the top surface of the magnetic stack layer; and
   patterning the magnetic stack layer to form a magnetic tunnel junction (MTJ) over at least one of the conductive lines, using the topography of the alignment marks visible in the top surface of the magnetic stack layer to align the MTJ to the conductive lines.

12. The method according to claim 11, wherein filling the alignment mark and conductive line patterns with a conductive material comprises:
   depositing a conductive material over the insulating layer to fill the conductive line pattern and alignment marks, leaving excess conductive material disposed over at least the conductive line pattern; and
   chemically-mechanically polishing the insulating layer top surface to form the conductive lines, leaving conductive material residing within the alignment marks.

13. The method according to claim 11, wherein forming the masking layer comprises:
   depositing a masking material over the conductive lines and alignment mark pattern;
   patterning the masking material; and
   removing the masking material from over the alignment mark pattern, leaving masking material residing over the conductive lines.

14. The method according to claim 13, wherein the masking material comprises a resist.

15. The method according to claim 13, wherein the masking material comprises a nitride.

16. The method according to claim 15, wherein the masking material comprises tantalum nitride or silicon nitride.

17. The method according to claim 13, further comprising:
   depositing a resist over the masking layer, after depositing the masking material; and
   using the resist to pattern the masking layer.

18. The method according to claim 11, wherein depositing a conductive material comprises depositing a material including copper.

19. The method according to claim 18, further comprising depositing a liner, before depositing the conductive material.

20. The method according to claim 1, wherein defining the pattern for the plurality of alignment marks and the pattern for the plurality of conductive lines within the insulating layer comprises defining alignment marks and conductive lines having a same depth within the insulating layer.

21. The method according to claim 11, wherein patterning the insulating layer to form a plurality of alignment marks and a plurality of trenches for conductive lines within the insulating layer comprises patterning alignment marks and trenches for conductive lines having a same depth within the insulating layer.

22. The method according to claim 1, wherein depositing the magnetic stack layer comprises:
   depositing a first magnetic layer;
   depositing a dielectric layer over the first magnetic layer; and
   depositing a second magnetic layer over the dielectric layer.

23. The method according to claim 22, wherein depositing the first magnetic layer and depositing the second magnetic layer comprise depositing a plurality of layers of materials comprising PtMn, CoFe, Ru, NiFe, Ni, Co, Ta, TaN, Cu, and/or combinations thereof.

24. The method according to claim 22, wherein depositing the dielectric layer comprises depositing aluminum oxide.

25. The method according to claim 11, wherein depositing the magnetic stack layer comprises:
   depositing a first magnetic layer;
   depositing a dielectric layer over the first magnetic layer; and
   depositing a second magnetic layer over the dielectric layer.

26. The method according to claim 25, wherein depositing the first magnetic layer and depositing the second magnetic layer comprise depositing a plurality of layers of materials comprising PtMn, CoFe, Ru, NiFe, Ni, Co, Ta, TaN, Cu, and/or combinations thereof.

27. The method according to claim 25, wherein depositing the dielectric layer comprises depositing aluminum oxide.

* * * * *